(12) United States Patent
Kuroda et al.

(10) Patent No.: US 8,309,856 B2
(45) Date of Patent: Nov. 13, 2012

(54) CIRCUIT BOARD AND MANUFACTURING METHOD THEREOF

(75) Inventors: Nobuhisa Kuroda, Ogaki (JP); Naoki Kubota, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 854 days.

(21) Appl. No.: 12/264,386

(22) Filed: Nov. 4, 2008

(65) Prior Publication Data
US 2009/0114431 A1 May 7, 2009

Related U.S. Application Data

(60) Provisional application No. 60/985,847, filed on Nov. 6, 2007.

(51) Int. Cl.
*H05K 1/09* (2006.01)
(52) U.S. Cl. ........ 174/257; 174/261; 438/612; 438/613; 438/614; 257/678; 257/737; 257/738; 257/773; 257/781; 428/209
(58) Field of Classification Search .................. 174/257, 174/261; 438/612–614; 257/678, 737, 738, 257/773, 781; 428/209
See application file for complete search history.

(56) References Cited

U.S. PATENT DOCUMENTS

| | | | | |
|---|---|---|---|---|
| 6,228,466 B1* | 5/2001 | Tsukada et al. | ............ | 428/209 |
| 7,213,329 B2* | 5/2007 | Kim et al. | ............ | 29/829 |
| 7,230,339 B2* | 6/2007 | Key et al. | ............ | 257/773 |
| 7,294,929 B2* | 11/2007 | Miyazaki | ............ | 257/737 |
| 7,415,761 B2* | 8/2008 | Hirose et al. | ............ | 29/852 |
| 7,576,438 B2* | 8/2009 | Jung et al. | ............ | 257/781 |
| 7,701,061 B2* | 4/2010 | Kawashiro | ............ | 257/766 |
| 7,832,098 B2* | 11/2010 | Hirose et al. | ............ | 29/852 |
| 2003/0022477 A1* | 1/2003 | Hsieh et al. | ............ | 438/612 |
| 2003/0178229 A1* | 9/2003 | Toyoda et al. | ............ | 174/261 |
| 2004/0026781 A1* | 2/2004 | Nakai | ............ | 257/737 |
| 2004/0188836 A1* | 9/2004 | Key et al. | ............ | 257/738 |
| 2005/0146030 A1* | 7/2005 | Miyazaki | ............ | 257/738 |
| 2005/0280130 A1* | 12/2005 | Nakai | ............ | 257/678 |
| 2006/0035453 A1* | 2/2006 | Kim et al. | ............ | 438/613 |
| 2006/0159885 A1* | 7/2006 | Shirai et al. | ............ | 428/131 |
| 2007/0095466 A1* | 5/2007 | Tsuda | ............ | 156/272.2 |
| 2007/0235218 A1* | 10/2007 | Miyamoto et al. | ............ | 174/261 |
| 2008/0026559 A1* | 1/2008 | Miyazaki | ............ | 438/614 |
| 2008/0081457 A1* | 4/2008 | Lin et al. | ............ | 438/614 |
| 2008/0264681 A1* | 10/2008 | Iwai et al. | ............ | 174/257 |
| 2009/0285980 A1* | 11/2009 | Iwai et al. | ............ | 427/98.4 |

FOREIGN PATENT DOCUMENTS

JP       10-154876       6/1998

(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A circuit board and method of manufacturing a circuit board. The circuit board includes a substrate, a conductor layer formed on the substrate, and an insulation layer formed on the substrate and the conductor layer, the insulating layer having an opening with an undercut therein, the opening reaching the conductor layer. A metal layer is formed in the opening of the insulation layer and connected to the conductor layer, a solder layer formed in the opening of the insulation layer and outside of the opening; and an alloy layer formed in a boundary region between the metal layer and the solder layer in the opening. The alloy layer includes a metal of the metal layer and a composition of the solder layer, the alloy layer being more fragile than the metal layer and being formed in a position misaligned from an edge of the undercut of the opening formed on the insulation layer.

15 Claims, 11 Drawing Sheets

FOREIGN PATENT DOCUMENTS

| | | |
|---|---|---|
| JP | 11-233679 | 8/1999 |
| JP | 2001-284782 | 10/2001 |
| JP | 2002-171052 | 6/2002 |
| JP | 2002-368397 | 12/2002 |
| JP | 2006-114705 | 4/2006 |
| JP | 2006-114706 | 4/2006 |

* cited by examiner

| ITEMS | | SAMPLE 1 | SAMPLE 2 | SAMPLE 3 | SAMPLE 4 |
|---|---|---|---|---|---|
| CONSTI-TUTION | DISTANCE FROM THE UPPER EDGE OF THE UNDERCUT TO THE ALLOY LAYER, H1 | 0.81 μm | 5.00 μm | 2.54 μm | 8.24 μm |
| | HEIGHT ON THE UNDERCUT, H2 | 3.89 μm | 4.58 μm | 2.78 μm | 2.92 μm |
| | DEPTH OF ETCHING, H3 | 2.78 μm | 2.92 μm | 1.94 μm | 1.81 μm |
| | DISTANCE FROM THE LOWER EDGE OF THE UNDERCUT TO THE ALLOY LAYER, H4 | 3.59 μm | 9.58 μm | 5.32 μm | 11.16 μm |
| | THICKNESS OF Ni, H5 | 7.48 μm | 12.50 μm | 7.26 μm | 12.97 μm |
| | LENGTH OF THE UNDERCUT, L | 5.69 μm | 6.11 μm | 4.86 μm | 4.22 μm |
| PROPER-TY | BALL SHARE (g) | 755.00 | 705.85 | 704.54 | 733.02 |
| | IMPACT RESISTANCE (ORDER OF STRENGTH) | 4 | 2 | 3 | 1 |

CIRCUIT BOARD AND MANUFACTURING METHOD THEREOF

CROSS-REFERENCE TO RELATED APPLICATIONS

The present application claims the benefits of priority to U.S. Application No. 60/985,847, filed Nov. 6, 2007. The contents of that application are incorporated herein by reference in their entirety.

BACKGROUND OF THE INVENTION

1. Technical Field

The present invention relates to a circuit board, particularly a circuit board comprising electrode structure with good drop resistance and manufacturing method thereof.

2. Background Art

Circuit boards comprising BGA (Ball Grid Array) are used in various fields. BGA electrode structure comprising a nickel (Ni) layer between a conductor layer (electrode pad of circuits) and solder pad (solder ball) is disclosed in Japanese published unexamined application No. H10-154876 publication. Furthermore, an electrode structure comprising a nickel alloy layer such as Ni—Sn between a nickel layer and a solder bump is disclosed in Japanese published unexamined application No. 2006-114706 publication. The entire content of each of H10-154876 and 2006-114706 is incorporated herein by reference.

Circuit substrates comprising BGA are used by incorporating them in various devices, and some of them are used for portable electronic devices, for example, cell phones. Circuit substrates used for portable devices are required to be good in drop resistance property. This is because portable devices themselves are often dropped while in use.

SUMMARY OF THE INVENTION

One aspect of the invention relates to a circuit board including a substrate, a conductor layer formed on the substrate, and an insulation layer formed on the substrate and the conductor layer, the insulating layer having an opening with an undercut therein, the opening reaching the conductor layer. A metal layer is formed in the opening of the insulation layer and connected to the conductor layer, a solder layer formed in the opening of the insulation layer and outside of the opening; and an alloy layer formed in a boundary region between the metal layer and the solder layer in the opening. The alloy layer includes a metal of the metal layer and a composition of the solder layer, the alloy layer being more fragile than the metal layer and being formed in a position misaligned from an edge of the undercut of the opening formed on the insulation layer.

Another aspect of the invention relates to a manufacturing method for a circuit board. The method includes forming a conductor pattern on a substrate, forming a solder resist layer on the substrate and the conductor pattern, and forming an opening in the solder resist layer, which reaches the conductor pattern and has an undercut. Also included is forming a metal layer connected to the conductor pattern in the opening of the insulation layer so that the edge is misaligned from the edge of the undercut, and forming a solder layer inside of the opening and outside of the opening. By heating the solder layer, both a solder bump and an alloy layer made of a metal of the metal layer and an element of the solder layer in the boundary between the metal layer and the solder bump.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

As noted above, circuit boards used for portable electronic devices are desired to have drop resistance. The present inventors have recognized that while conventional BGA boards may have sufficient strength under normal use, circuit boards used for portable electronic devices are desired to have further improved drop resistance.

The present invention is provided in view of abovementioned problems and is intended to provide circuit boards with high drop resistance, and manufacturing method thereof. In order to achieve the abovementioned purpose, a circuit board related to the first viewpoint of the present invention includes a substrate, a conductor layer formed on the substrate, and an insulation layer formed on the substrate and the conductor layer. An opening that reaches the conductor layer is formed in the insulating layer and has an undercut. A metal layer is formed in the opening of the insulation layer and connected to the conductor layer, and a solder layer is formed in the opening of the insulation layer and outside of the opening. An alloy layer, is formed in a boundary region between the metal layer and the solder layer in the opening of the insulation layer. The metal layer consists of metal (Ni), which constitutes the metal layer, and composition (Sn) of the solder layer, The alloy layer being more fragile than the metal layer, and being formed in a position misaligned (shifted) from one edge of the undercut of the opening formed on the insulation layer.

For example, the conductor layer consists of copper pattern, the insulation layer consists of solder resist layers, the metal layer consists of Ni, the solder layer consists of lead-free solder containing Sn, and the alloy layer contains alloy of Ni and Sn.

A distance from the edge of the undercut to the alloy layer is, for example, 6-30 μm, preferably, more than 10 μm. The edge of the undercut is preferably formed in a position of less than ¼ of thickness of the solder resist.

A ratio H1:D of distance (H1) from the edge of the undercut to the alloy layer and diameter (D) of the opening is preferably within 1-0.01.

An example method, for achieving the abovementioned purpose, of manufacturing a circuit board related to the second viewpoint of the present invention includes forming a conductor pattern on a substrate, forming a solder resist layer on the substrate and the conductor pattern, and forming an opening, which reaches the conductor pattern and has an undercut, on the solder resist layer. Also included is forming a metal layer connected to the conductor pattern in the opening of the insulation layer so that the edge is misaligned from the edge of the undercut, and forming a solder layer inside of the opening and outside of the opening, and forming a solder bump by heating the solder layer and to form an alloy layer made of metal and solder in a boundary between the metal layer and a solder bump.

For example, the metal layer contains Ni, the solder layer contains lead-free solder containing Sn, and the alloy layer contains alloy of Ni and Sn.

In a process to form the metal layer, for example, the metal layer is formed so that the upper surface of the metal layer is in a position separate from the edge of the undercut by 6-30 µm, preferably, more than 10 µm.

In a process to form the opening, for example, the opening is formed so that the edge of the undercut is in a position of less than ¼ of thickness of the solder resist.

Values of ratio of the distance (H1) from the edge of the undercut to the alloy layer and diameter (D) of the opening are preferably within 1-0.01.

Figure 1A:
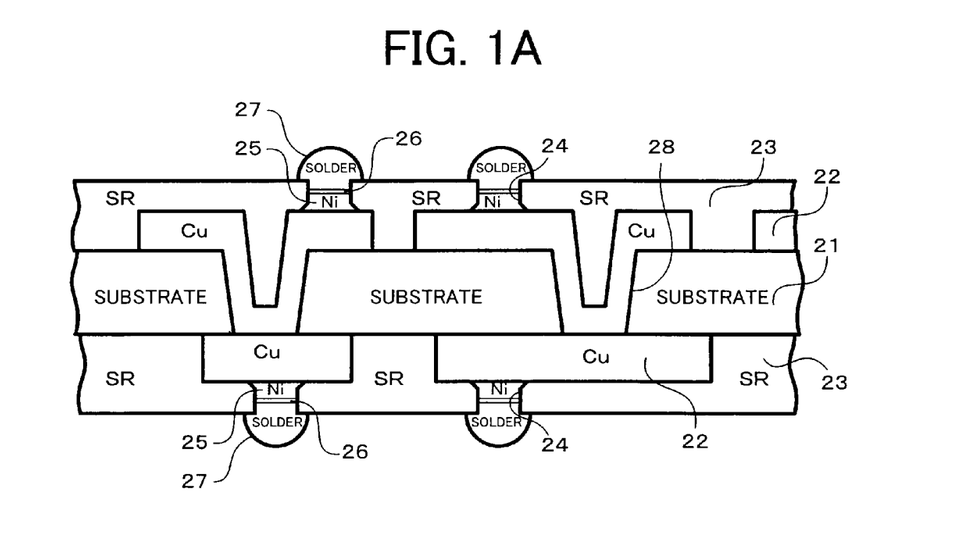
FIG. 1A is a cross-sectional view of the circuit board related to one embodiment of the present invention.

The embodiments will now be described with reference to the accompanying drawings. A circuit board 11 according to one embodiment is shown in FIG. 1A, which includes substrate 21; wiring pattern 22 formed on substrate 21; solder resist layer 23 formed on substrate 21 and wiring pattern 22. Also included is contact hole 24; nickel (Ni) layer 25 formed in contact hole 24; alloy layer 26 formed on nickel (Ni) layer 25; and solder bump (solder ball) 27 formed on the alloy layer 26.

Figure 1B:
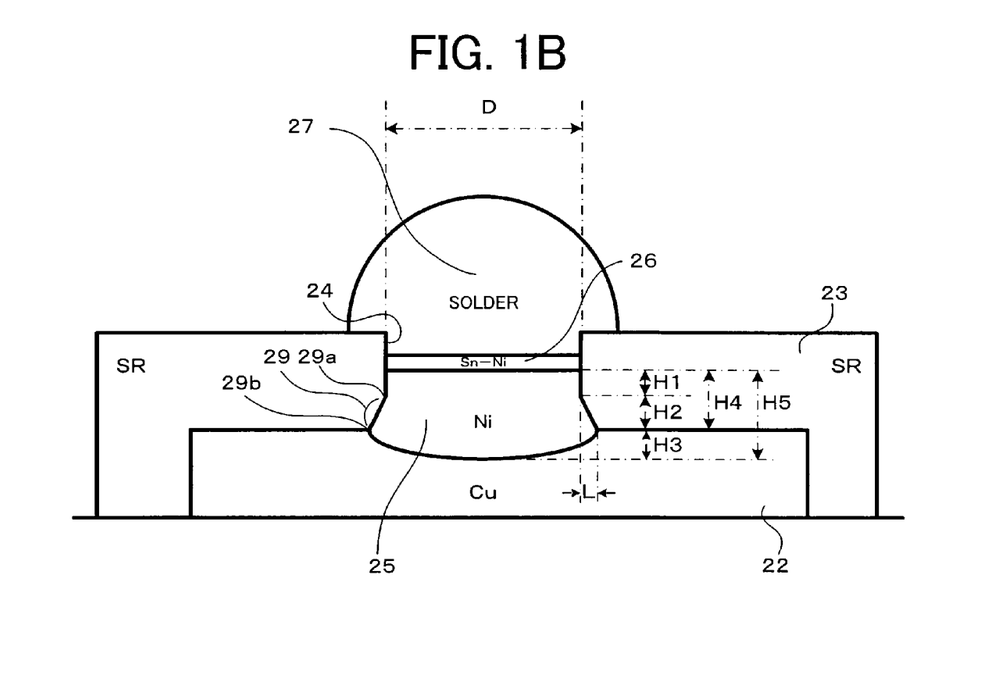
FIG. 1B is an enlarged view of the bump electrode of the circuit board shown in FIG. 1A.

In the embodiment of FIG. 1A, the substrate 21 consists, for example, insulating flat plates consisting of synthetic resin boards of 0.5-2.0 mm in thickness. The wiring pattern 22 consists of copper (Cu) and is formed on both major faces of the substrate 21 and makes up a circuit pattern. As shown in FIG. 1B, contact parts of the connection pad of the circuit pattern 22 and the Ni layer 25 are etched to make them concave.

The wiring pattern 22 formed on one surface of the substrate 21 and the wiring pattern 22 formed on other surface of the substrate 21 are connected to each other via the via-hole 28 formed on the substrate 21 as needed. The solder resist layer 23 has properties to reject solder and is formed to be 10-70 µm in thickness.

The contact hole 24 is formed to be 30-500 µm in diameter on the connection pad of the wiring pattern 22 of the solder resist layer 23 in order to connect to the solder bump 27 and the wiring pattern 22.

As enlarged and shown in FIG. 1B, the undercut 29, whose diameter becomes big as it goes downward (backward), is formed on the contact hole 24. The edge (a part, which is the thinnest from the reaming part becoming thinner gradually) 29a of the undercut 29 is positioned in a position of ¼ or less of thickness of the solder resist layer 23 and the terminal 29b of the undercut 29 is positioned near the surface of the wiring pattern 22.

The nickel (Ni) layer 25 is formed to be 6-30 µm, preferably more than 10 µm in thickness on the electrode pad of the wiring pattern 22 in the contact hole 24 and filled to higher position than the edge (upper edge) 29a of the undercut 29.

The alloy layer 26 is an alloy layer of nickel forming the Ni layer 25 and Sn, Cu, and so on contained in the solder bump 27, for example, it consists of Ni—Sn alloy and it is formed to be thin, approximately 1 µm.

The solder bump 27 is a hemispherical solder ball consisted of lead-free solder such as Sn—Ag—Cu (4Ag-0.5Cu).

According to the circuit board 11 in abovementioned structure of FIGS. 1A and 1B, the alloy layer 26 consisting of Sn—Ni alloy formed in a boundary between the solder bump 27 and the Ni layer 25 has a property of being relatively fragile. On the other hand, impact (stress) due to drop of the circuit board 11 is mainly concentrated on parts near the edge 29a of the undercut 29. Therefore, if the alloy layer 26 is in the same position as the edge 29a of the undercut 29, stronger stress due to drop is applied to the alloy layer 26, which is fragile.

In one embodiment, the alloy layer 26 is placed in a position off the edge 29a of the undercut 29. Thus, even with drop impact, the stress is really applied to the alloy layer 26, so falling-off in a boundary of the alloy layer 26 does not really occur.

Figure 2:
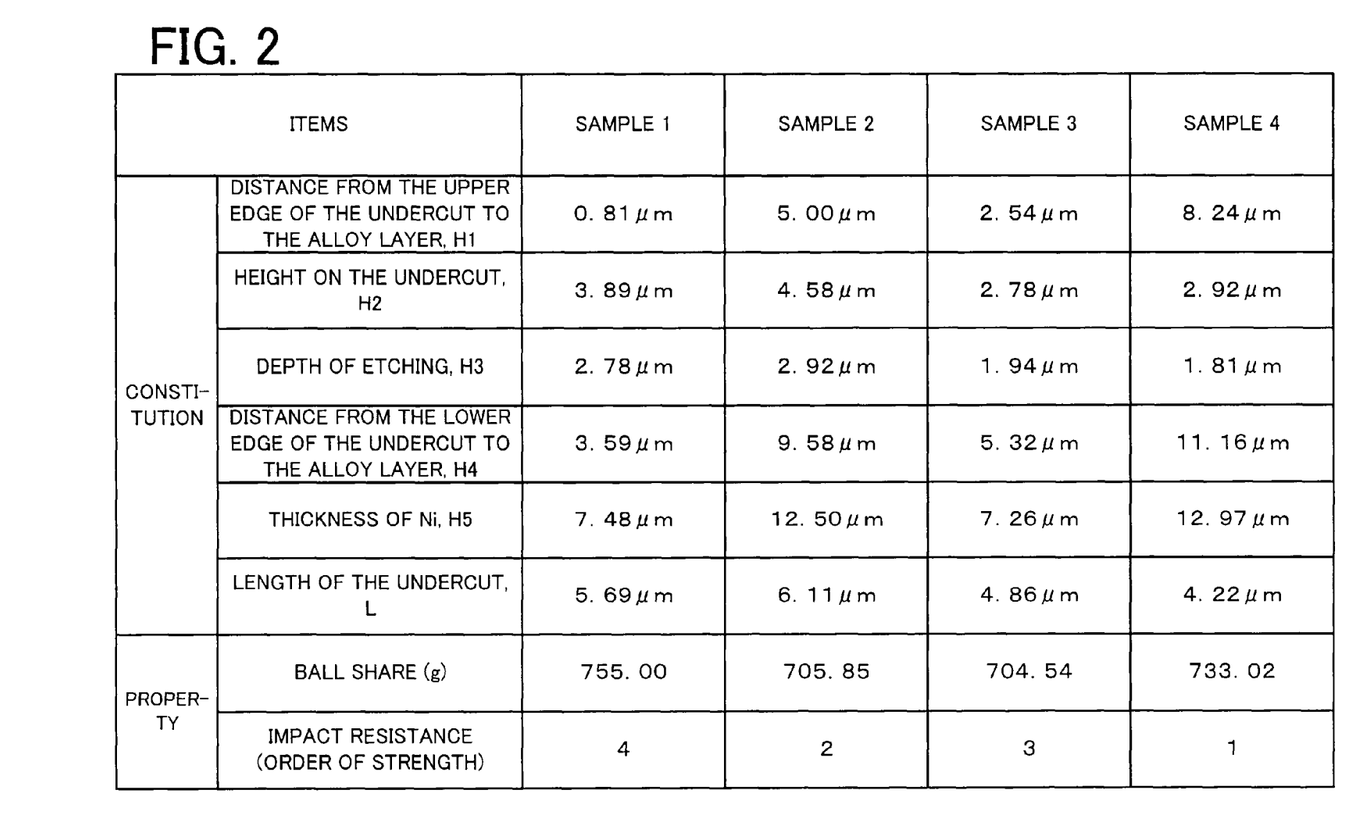
FIG. 2 is a drawing that shows the structure and property of samples.

In order to confirm this effect, Sample group 1-Sample group 4, which have average sizes shown in FIG. 2, are created to obtain shared ball strength. Additionally, tests that circuit boards are dropped from height of 1 m were actually conducted. As a result of measuring shared ball strength, as shown in FIG. 2, each sample shows high shared ball strength of about 704 g-755 g.

Figure 3A:
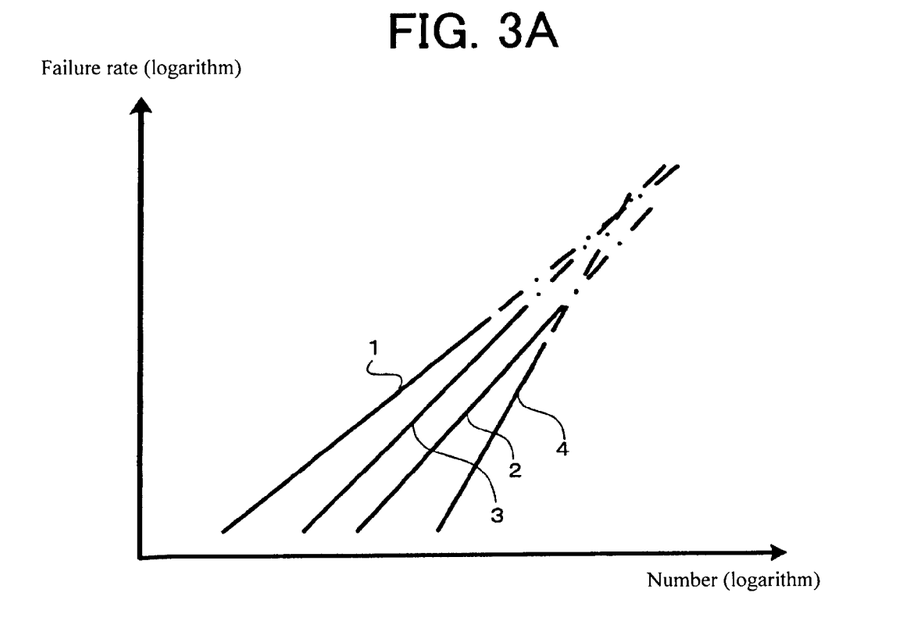
FIG. 3A is a double logarithmic chart that shows experimental results of the number of drops and failure rate of the samples.

Next, drop resistance properties of the samples were measured. In other words, each sample is actually dropped from a height of 1 m to obtain rate and relationship between numbers of drops (N) and solder bumps where defects occur. This result is shown in FIG. 3A. The horizontal axis in FIG. 3A shows logarithm of number of drops (N) and the vertical axis shows logarithm of rate of solder bumps where defects occur (percentage).

From FIG. 3A, although defect rate increases as number of drops increases, it can be confirmed that the defect rate is low in order of Sample 4, Sample 2, Sample 3, and Sample As shown in FIG. 2, length of the distance H1 from the edge 29a of the undercut 29 to the alloy layer 26 corresponds to strength of impact resistance. Therefore, it is deduced that there is a correlation between the distance H1 from the edge 29a of the undercut 29 to the alloy layer 26 and impact resistance.

On the other hand, correlation is not seen between height H2 of the undercut 29 (distance from the upper surface of the wiring pattern 22 to the edge 29a of the undercut 29) and impact resistance.

Furthermore, Drop resistance property of Sample 3 is greater than Drop resistance property of Sample 1; and Drop resistance property of Sample 4 is greater than Drop resistance property of Sample 2. On the other hand, depth of etching H3 of Sample 3 and 4 (amount of overetching) is almost equal, and depth of etching H3 of Sample 1 and 2 is almost equal. Therefore, it can be deduced that the deeper the etching H3, the better the drop resistance property.

Additionally, Drop resistance property of Sample 2 is greater than Drop resistance property of Sample 1; and Drop resistance property of Sample 4 is greater than Drop resistance property of Sample 3. On the other hand, thickness of the Ni layer H5 of Sample 2 and 4 is almost equal and relatively big, and thickness of the Ni layer H5 of Sample 1 and 3 is almost equal and relatively small. Therefore, it can be deduced that the bigger the thickness of the Ni layer H5, the better the drop resistance property.

Correlation between length L of the undercut 29 (horizontal spread of the undercut 29) and impact resistance cannot be seen.

Figure 3B:
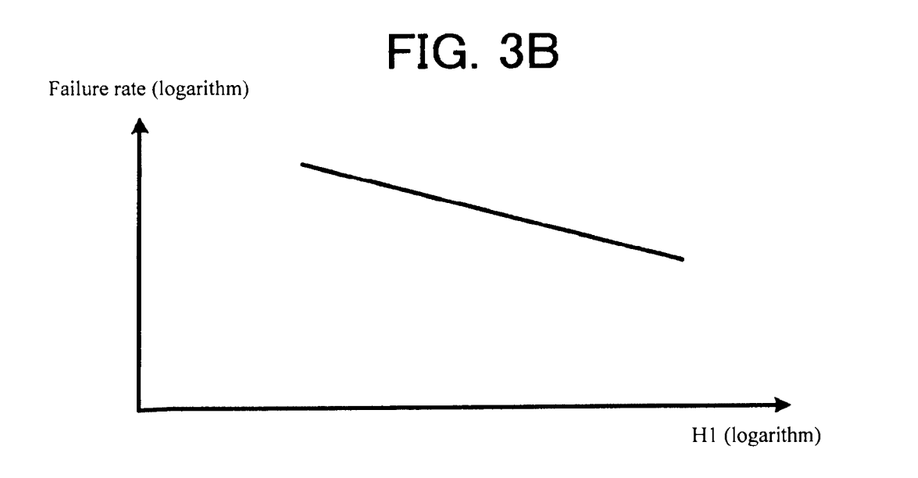
FIG. 3B is a double logarithmic chart that shows the relationship between the distance H1 from the edge of the undercut to the alloy layer and failure rate.
Figure 4:
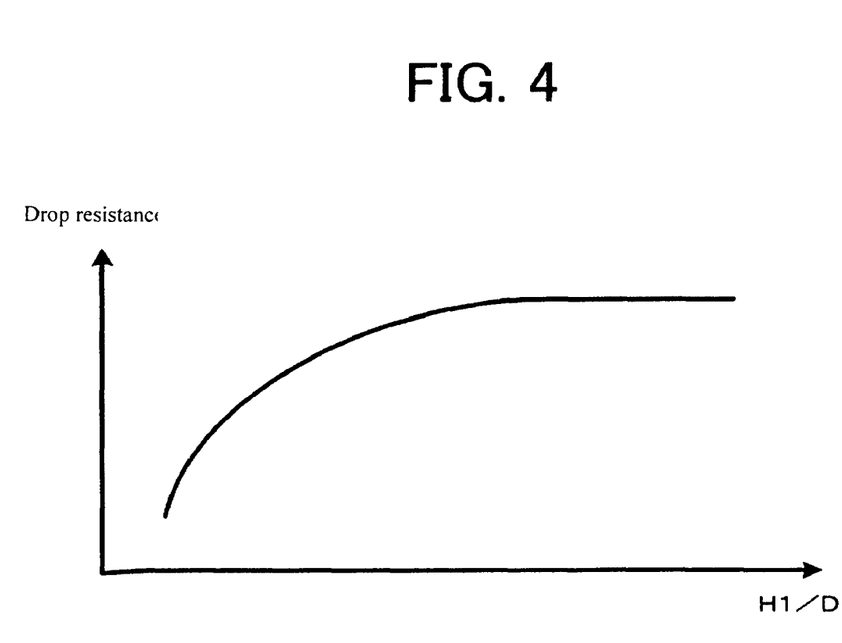
FIG. 4 is a double logarithmic chart that shows the relationship between ratio between the distance H1 and the diameter D of the contact hole and drop resistance.

From the analysis above, it was deduced that there is some correlation between the distance H1 from the edge 29a of the undercut 29 to the alloy layer 26 and impact resistance. Based on further analysis, it was revealed that logarithm of the distance H1 from the edge 29a of the undercut 29 to the alloy layer 26 and logarithm of impact resistance are almost in a relationship of a direct function as shown in FIG. 3B.

Also, it was found that if the diameter D of the contact hole 24 is too big or small, the relationship between drop resistance and the distance H1 becomes weak. It is deduced that this is because the effect of the undercut 29 to drop resistance becomes small if the diameter D of the contact hole 24 is too big or small.

Figure 5:
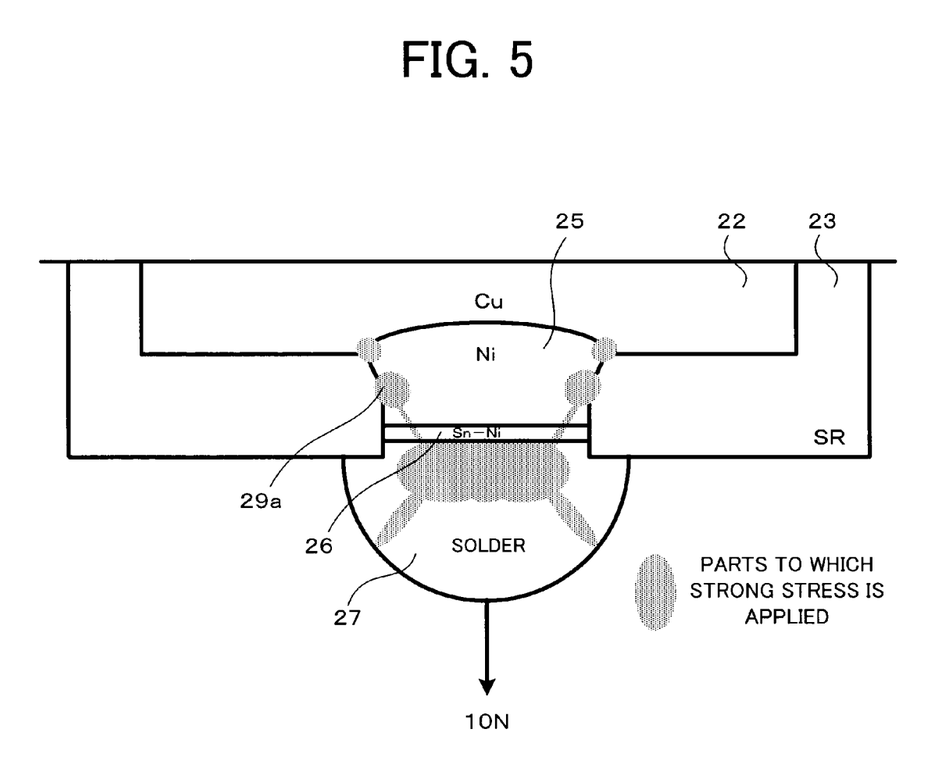
FIG. 5 is a drawing that shows stress distribution when solder bumps are pulled.

Therefore, the relationship between the ratio of the distance H1 and the diameter D of the contact hole 24 and drop resistance was examined. As shown in FIG. 5, as the amount of misalignment H1/diameter D becomes big, the occurrence rate of defects in drop tests decreases, however, it will be saturated gradually. Thus, it was found that approximately 1-0.01 is preferable for values of rate H1/D of the distance H1 and the diameter D of the contact hole 24.

Next, electrode structure shown in FIG. 1B was formed and the solder bump 27 was pulled using force of 10 N. Parts in which stress is applied at this time are shown in FIG. 5. As shown in FIG. 5, it was confirmed that stress is collected near the edge part 29a of the undercut 29, the solder bump 27, and the alloy layer 26.

From these experiments, it is deduced that if the alloy layer 26 is positioned in the same position or near the edge 29a of the undercut 29 in the contact hole 24, stress is applied to the fragile alloy layer 26 and the possibility of occurrence of falling-off in a boundary increases. On the other hand, according to the mode of this embodiment, it is deduced that since the fragile alloy layer 26 is formed separately from an area in which stress is applied, defects do not really occur.

Based on the analysis above and additional analysis, at least the following points were revealed:

1. If the undercut 29 is formed in the contact hole 24, positions of the edge 29a of the undercut 29 and the alloy layer 26 are preferably misaligned. An amount of misalignment (distance) is preferably 6-30 μm, more preferably, more than 10 μm;

2. Overetching H3 of the pad electrode is preferably small;

3. The edge 29a of undercut 29 is preferably in a position of less than ¼ of thickness of the solder resist layer 23; and 4. A ratio of Height H1:diameter of the contact hole 24 is preferably within 1-0.01.

Next, an example manufacturing method for circuit boards which have abovementioned structure is explained by referring to FIG. 6A-FIG. 6J.

Figure 6A:
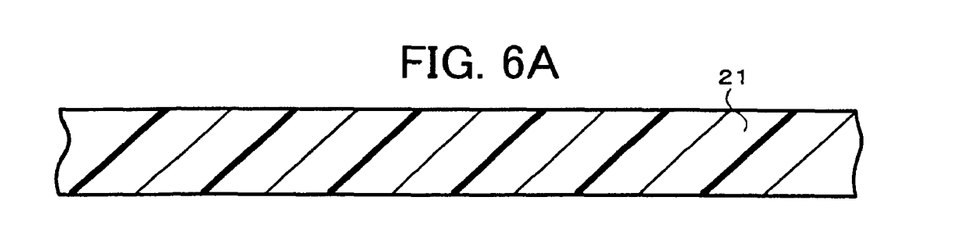
FIG. 6A-6J are process charts for explaining a manufacturing method for circuit boards related to one embodiment of the present invention.
Figure 6B:
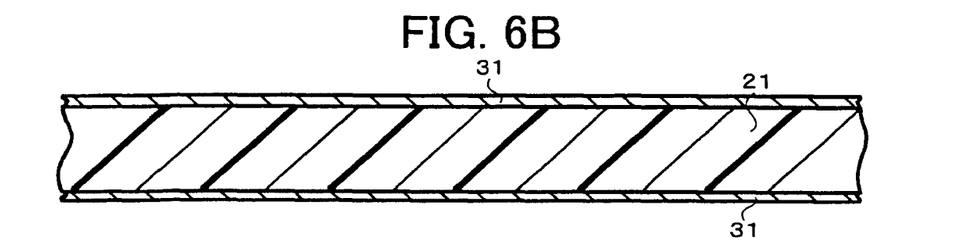
Figure 6C:
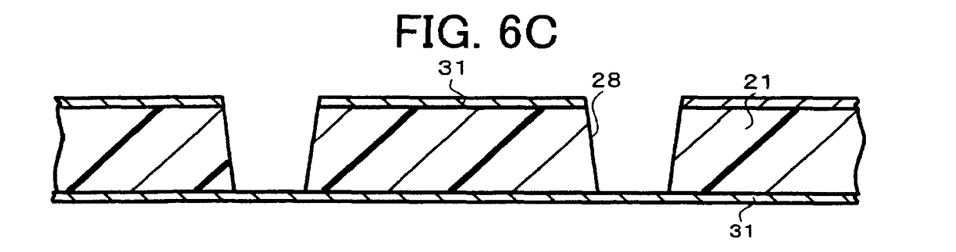

As shown in FIG. 6A, the insulation substrate 21 consisting of glass epoxy resin of 0.8 mm in thickness or BT (bismaleimide triazine) resin is prepared. As shown in FIG. 6B, the copper foil 31 is formed on two surfaces (the upper surface and the lower surface) of the substrate 21. As shown in FIG. 6C, the via-hole 28 is formed by perforating the substrate 21 from one surface using laser. At this time, the copper foil 31 on the other surface is retained.

Figure 6D:
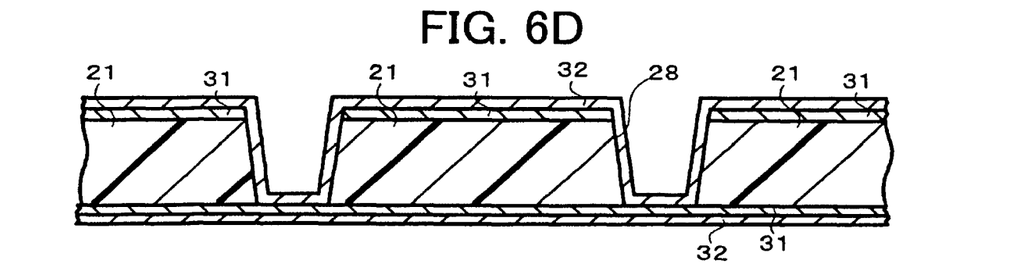

The substrate 21, to whish catalyst was given, is immersed in electroless copper plating solution in the following composition, and, as shown in FIG. 6D, the electroless copper plating film 32 of 0.6-3.0 μm in thickness is formed on all over it.

Electroless Plating Solution:
$NiSO_4$: 0.003 mol/l;
Tartaric acid: 0.200 mol/l;
Copper sulfate: 0.030 mol/l;
HCHO: 0.050 mol/l;
NaOH: 0.100 mol/l;
$\alpha,\alpha'$-bipyridyl: 100 mg/l;
Polyethyleneglycol (PEG): 0.10 g/l.

Electroless plating condition: At solution temperature of 34° C. for 40 minutes.

Figure 6E:
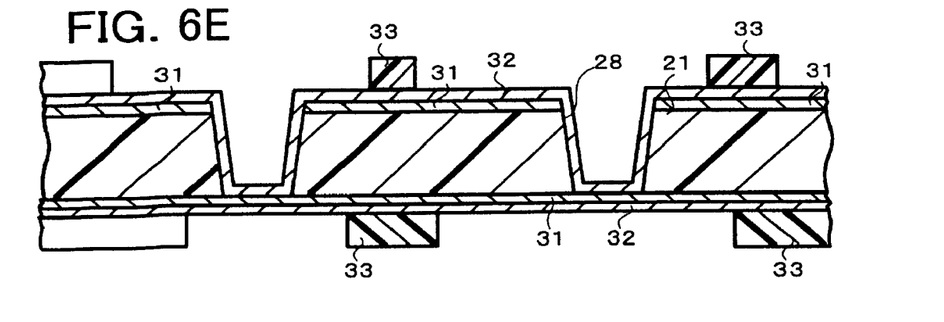

A commercially available photosensitive dry film is attached on the substrate 21, on which the electroless copper plating film 32 is formed, and a mask is mounted to be exposed with 100 mJ/cm$^2$ and processed using 0.8% sodium carbonate aqueous solution so as to form the plating resist 33 of 20 μm in thickness as shown in FIG. 6E.

The substrate 21 is washed using water at 50° C. and defatted, and after washing using water at 25° C., it is further washed using sulfuric acid and electroplated in the following condition.

Electroplating solution:
Sulfuric acid: 2.24 mol/l;
Copper sulfate: 0.26 mol/l; and
Additive: 19.5 ml/l (Manufactured by Atotech Japan, Cupracid GL).

Electroplating condition:
Current density: 1 A/dm$^2$;
Time: 65 minutes; and
Temperature: 22±2° C.

Figure 6F:
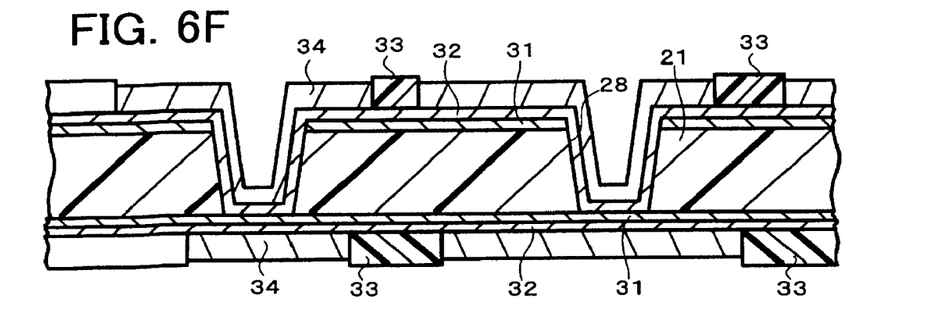

According to this, as shown in FIG. 6F, the electro copper plating film 34 of 20 μm in thickness is formed in parts, in which the plating resist 33 is not formed.

Figure 6G:
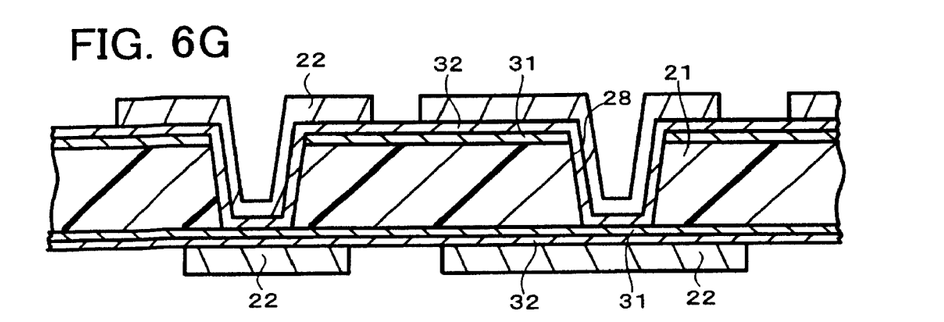
Figure 6H:
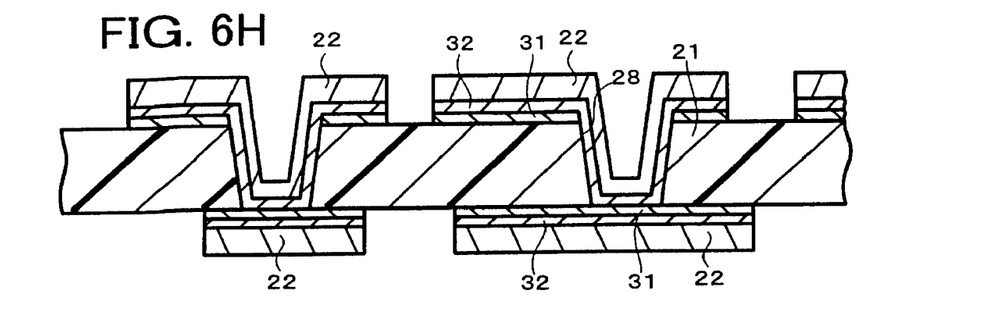

Next, as shown in FIG. 6G, the plating resist 33 is peeled and removed using 5% KOH. Subsequently, as shown in FIG. 6H, the copper foil 31 below the plating resist 33 and the electroless copper plating film 32 are etched with mixture of sulfuric acid and hydrogen peroxide for removal by dissolving so that a plurality of the wiring pattern 22, which are independent of each other, are formed.

Figure 6I:
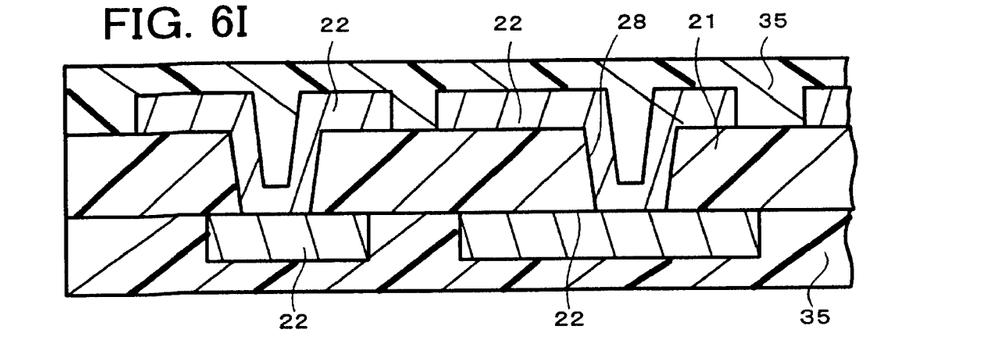

Next, as shown in FIG. 6I, solder resist composition is coated on both surfaces of the substrate 21 to make 300-400 μm in thickness by screen-printing so that the solder resist film 35 is formed. The solder resist composition is optional, but, for example, LPSR (TAIYO INK MFG. Co., Ltd. PSR4000-AUS303) can be used. Subsequently, it is dried at predetermined temperature for a predetermined time. In FIG. 6I, the wiring pattern 22 is shown with one layer.

Figure 6J:
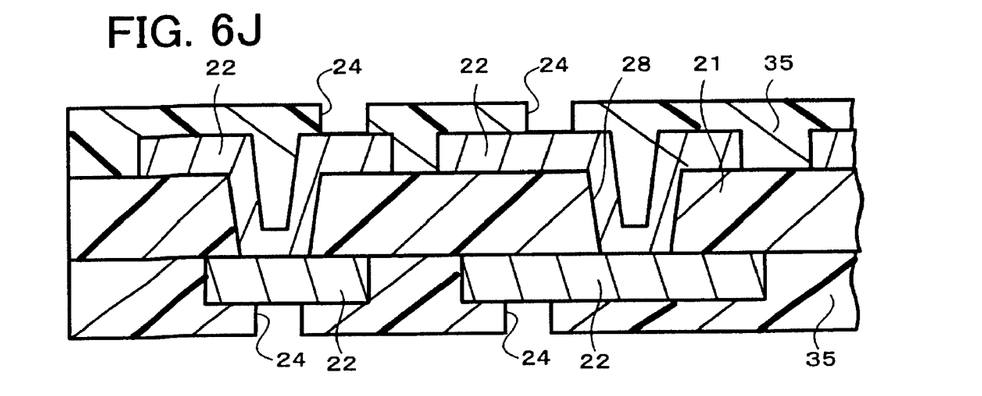
Figure 7A:
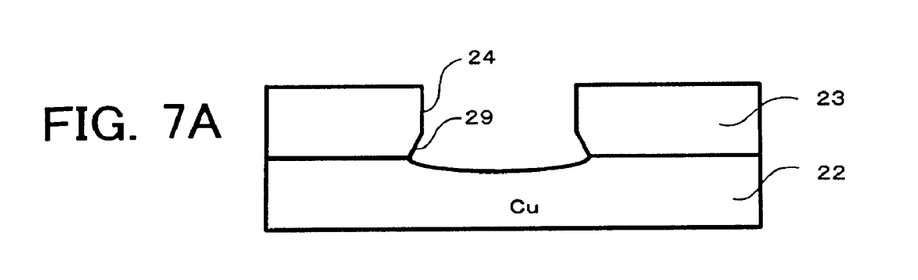
FIG. 7A-7D are process charts for explaining a manufacturing method for circuit boards related to one embodiment of the present invention.

Subsequently, a photo mask, on which patterns of the contact hole (solder resist opening) 29 are drawn, is attached firmly to the solder resist layer 35 so as to expose using ultraviolet at 800 mJ/cm$^2$ and process in DMTG solution, and as shown in FIG. 6J, form the contact hole 24 of 150 μm in a diameter. In this patterning process, as enlarged and shown in FIG. 7A, the undercut 29 is formed in the contact hole 24.

By changing composition of solder resist, coating condition, drying condition, exposure condition, etching (processing) condition, experiments are conducted to set conditions so that the undercut 29, which has appropriate formation and size, can be formed.

Subsequently, the solder resist layer 35 is hardened by heating processing at predetermined temperature, e.g., 100° C., for predetermined time so that the solder resist layer 23 of approximately 300 μm in thickness, which has the contact hole 24, is formed.

Figure 7B:
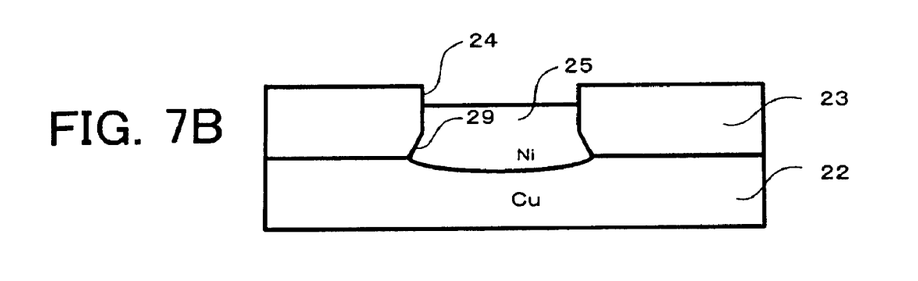

Next, the substrate 21, on which the solder resist layer 23 was formed, is immersed in electroless nickel plating solution of pH=4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 45 minutes to form the nickel layer 25 of 12 μm in thickness on the contact hole 24 as enlarged and shown in FIG. 7B.

In this process, the Ni layer 25 is grown so that the upper surface exceeds the position of the edge 29a of the undercut 29.

Figure 7C:
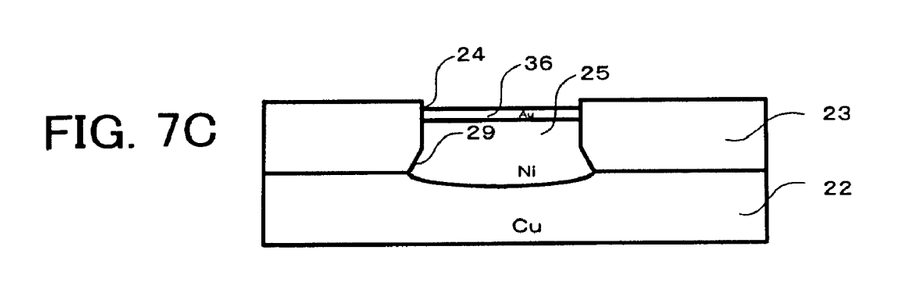

The substrate 21 is immersed in electroless gold plating solution containing potassium cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) in the condition at 80° C. for 7.5 minutes so as form the gold layer 36 of 0.03 μm in thickness on the Ni layer 25.

Figure 7D:
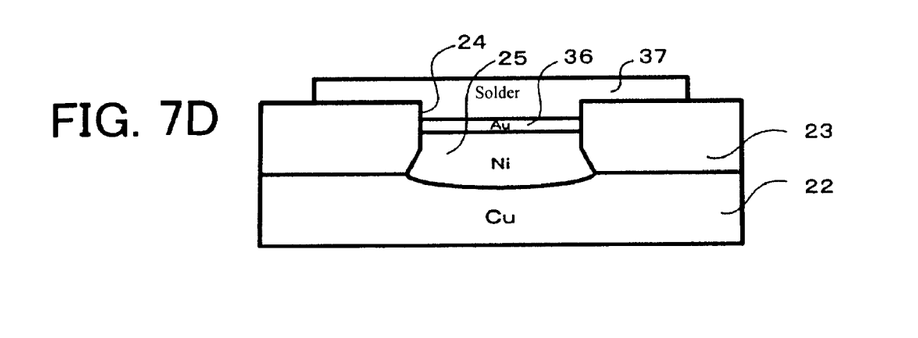

Next, as enlarged and shown in FIG. 7D, the solder paste 37 is printed on and near the contact hole 24 of the solder resist layer 23. For example, the solder paste 37 consists of Sn—Ag—Cu (4Ag-0.5Cu—Sn) and so forth.

Figure 8:
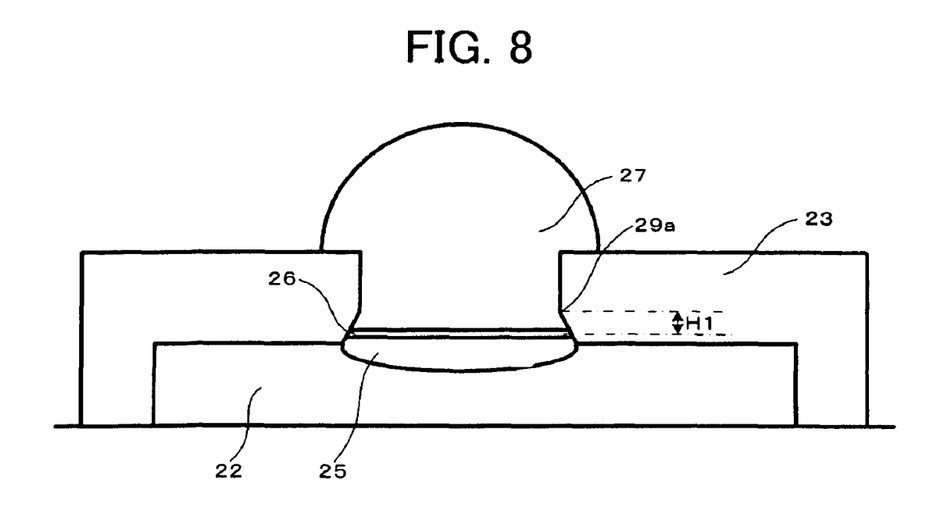
FIG. 8 is a cross-sectional view that shows the electrode structure related to other embodiments of the present invention.

Next, by reflowing at 250° C. in nitrogen atmosphere, as enlarged and shown in FIG. 8, the solder bump 27 is formed. At the time of reflowing, the gold layer 36 is diffused and disappeared in the solder bump 27. On the other hand, as described by referring to FIGS. 1A and 1B above, the Ni—Sn alloy layer 26, which is an alloy layer of Sn, which is a main component of the solder paste 37, and Ni, which is a main component of the Ni layer 25, is formed in a boundary between the Ni layer 25 and the solder bump 27. Since the upper surface of the Ni layer 25 is formed in a position shifted from the edge 29a of the undercut 29, the position of the alloy layer 26 is also a position shifted from the edge 29a.

In this way, the circuit board 11 in the constitution shown in FIG. 1A and FIG. 1B is formed.

As explained above, according to circuit boards related to embodiments above and a manufacturing method thereof, the alloy layer 26, which is fragile is formed in the position shifted from the edge 29a of the undercut 29, in which stress due to drop impact is concentrated. Therefore, drop impact occurs, and the impact is concentrated on the alloy layer 26, the alloy layer 26 is destroyed, and defects such as removal of the solder bump 27 do not often occur. Therefore, the reliability and yield rates are high.

The present invention is not limited to embodiments above but can be changed and applied variously. For example, in embodiments above, copper is formed using the wiring pattern 22, the Ni layer 25 is placed in the contact hole 24, and furthermore, the solder bump 27 is made to be lead-free solder containing Sn, but these materials can be modified as needed. For example, instead of the Ni layer 25, two layers of a Ni layer and Pd layer on a Ni layer are placed, and lead-free solder containing Sn as a main component can be used as the solder bump 27.

Additionally, optional metal layers and solder made from optional materials can be used for other applications except the above. However, the present invention is effective when an alloy layer of the metal layer (25) and solder is more fragile than the metal layer (25) placed in the contact hole.

Embodiments above show an example where the upper surface of the Ni layer 25 (the alloy layer 26) is positioned on the edge 29a of the undercut 29 (opening side), however, the upper surface of the Ni layer 25 may be positioned below the edge 29a of the undercut 29 (back side of the contact hole 24). However, from a viewpoint of impact resistance property, the alloy layer 26 is preferably positioned above the edge 29a of the undercut 29.

Figure 9A:
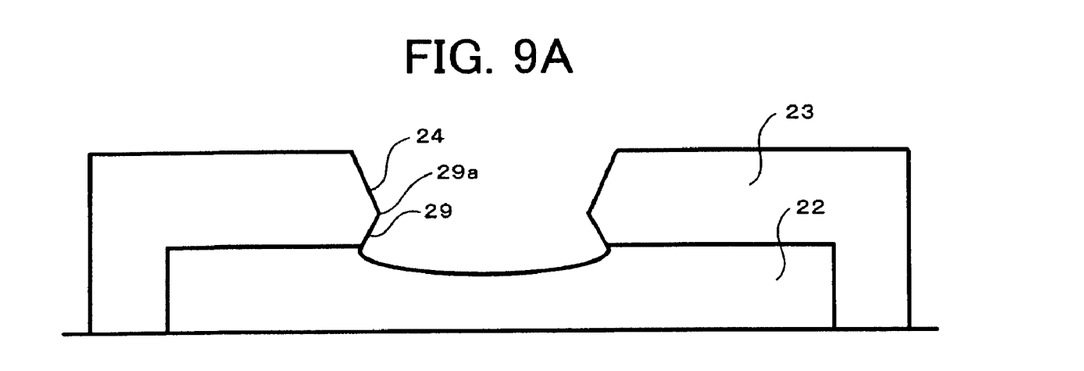
FIGS. 9A and 9B are drawings that show other examples of an undercut according to embodiments of the invention.
Figure 9B:
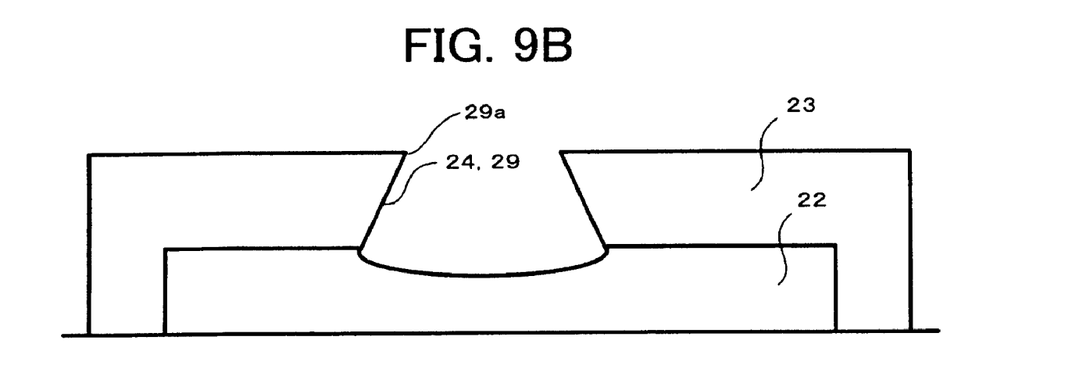

Moreover, in the embodiments above, formation of the contact hole 24 is one example, so it can be changed as needed. For example, as shown in FIG. 9A, the entire contact hole 24 may be formed into a taper shape. Also, as shown in FIG. 9B, the entire contact hole 24 may be formed into a taper shape, which enlarges as it retracts. In any case, when impact is applied to the substrate, the position of the alloy layer may be shifted from the position, in which stress is most applied.

Obviously, numerous modifications and variations of the present invention are possible in light of the above teachings. It is therefore to be understood that within the scope of the appended claims, the invention may be practiced otherwise than as specifically described herein.

The invention claimed is:

1. A circuit board comprising:
   a substrate;
   a conductor layer formed on the substrate;
   an insulation layer formed on the substrate and the conductor layer, the insulating layer having an opening with an undercut therein, the opening reaching the conductor layer;
   a metal layer formed in the opening of the insulation layer and connected to the conductor layer;
   a solder layer formed in the opening of the insulation layer and outside of the opening; and
   an alloy layer formed in a boundary region between the metal layer and the solder layer in the opening, the alloy layer comprising a metal of the metal layer and a composition of the solder layer, the alloy layer being more fragile than the metal layer and being formed in a position misaligned from an edge of the undercut of the opening formed on the insulation layer such that the alloy layer is positioned on a side of the edge which includes the solder layer, wherein a distance from the edge of the undercut to the alloy layer is 6-30 μm.

2. The circuit board according to claim 1, wherein:
   the conductor layer consists of copper pattern,
   the insulation layer consists of solder resist,
   the metal layer consists of Ni,
   the solder layer consists of lead-free solder containing Sn, and
   the alloy layer comprises an alloy of Ni and Sn.

3. The circuit board according to claim 1, wherein the distance from the edge of the undercut to the alloy layer is 10 μm-30 μm.

4. The circuit board according to claim 1, wherein the ratio H1:D is preferably within 1-0.01, where H1 is the distance from the edge of the undercut to the alloy layer, and D is the diameter of the opening.

5. The circuit board according to claim 1, wherein the metal of the metal layer consists of Ni, and the composition of the solder layer consists of Sn.

6. A circuit board comprising:
   a substrate;
   a conductor layer formed on the substrate;
   an insulation layer formed on the substrate and the conductor layer, the insulating layer having an opening with an undercut therein, the opening reaching the conductor layer;
   a metal layer formed in the opening of the insulation layer and connected to the conductor layer;
   a solder layer formed in the opening of the insulation layer and outside of the opening; and
   an alloy layer formed in a boundary region between the metal layer and the solder layer in the opening, the alloy layer comprising a metal of the metal layer and a composition of the solder layer, the alloy layer being more fragile than the metal layer and being formed in a position misaligned from an edge of the undercut of the opening formed on the insulation layer such that the alloy layer is positioned on a side of the edge which includes the solder layer, wherein the edge of the undercut is formed in a position within the bottom ¼ of the thickness of the solder resist.

7. The circuit board according to claim 6, wherein:
the conductor layer consists of copper pattern,
the insulation layer consists of solder resist,
the metal layer consists of Ni,
the solder layer consists of lead-free solder containing Sn, and
the alloy layer comprises an alloy of Ni and Sn.

8. The circuit board according to claim 6, wherein the ratio H1:D is preferably within 1-0.01, where H1 is the distance from the edge of the undercut to the alloy layer, and D is the diameter of the opening.

9. The circuit board according to claim 6, wherein the metal of the metal layer consists of Ni, and the composition of the solder layer consists of Sn.

10. A circuit board comprising:
a substrate;
a conductor layer formed on the substrate;
an insulation layer formed on the substrate and the conductor layer, the insulating layer having an opening with an undercut therein, the opening reaching the conductor layer;
a metal layer formed in the opening of the insulation layer and connected to the conductor layer;
a solder layer formed in the opening of the insulation layer and outside of the opening; and
an alloy layer formed in a boundary region between the metal layer and the solder layer in the opening, the alloy layer comprising a metal of the metal layer and a composition of the solder layer, the alloy layer being more fragile than the metal layer and being formed in a position misaligned from an edge of the undercut of the opening formed on the insulation layer, wherein a distance from the edge of the undercut to the alloy layer is 6-30 μm.

11. The circuit board according to claim 10, wherein the distance from the edge of the undercut to the alloy layer is 10 μm-30 μm.

12. The circuit board according to claim 10, wherein:
the conductor layer consists of copper pattern,
the insulation layer consists of solder resist,
the metal layer consists of Ni,
the solder layer consists of lead-free solder containing Sn, and
the alloy layer comprises an alloy of Ni and Sn.

13. The circuit board according to claim 10 wherein the metal of the metal layer consists of Ni, and the composition of the solder layer consists of Sn.

14. A circuit board comprising:
a substrate;
a conductor layer formed on the substrate;
an insulation layer formed on the substrate and the conductor layer, the insulating layer having an opening with an undercut therein, the opening reaching the conductor layer;
a metal layer formed in the opening of the insulation layer and connected to the conductor layer;
a solder layer formed in the opening of the insulation layer and outside of the opening; and
an alloy layer formed in a boundary region between the metal layer and the solder layer in the opening, the alloy layer comprising a metal of the metal layer and a composition of the solder layer, the alloy layer being more fragile than the metal layer and being formed in a position misaligned from an edge of the undercut of the opening formed on the insulation layer, wherein the edge of the undercut is formed in a position within the bottom ¼ of the thickness of the solder resist.

15. The circuit board according to claim 14 wherein the metal of the metal layer consists of Ni, and the composition of the solder layer consists of Sn.

* * * * *